United States Patent
Kobayashi et al.

(10) Patent No.: US 10,811,348 B2
(45) Date of Patent: Oct. 20, 2020

(54) METHOD OF MANUFACTURING WIRING SUBSTRATE

(71) Applicant: SHINKO ELECTRIC INDUSTRIES CO., LTD., Nagano (JP)

(72) Inventors: Kazuhiro Kobayashi, Nagano (JP); Yusuke Karasawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 221 days.

(21) Appl. No.: 15/810,578

(22) Filed: Nov. 13, 2017

(65) Prior Publication Data

US 2018/0151486 A1 May 31, 2018

(30) Foreign Application Priority Data

Nov. 30, 2016 (JP) ................................. 2016-232678

(51) Int. Cl.
*H01L 23/498* (2006.01)
*H01L 21/48* (2006.01)
*H01L 21/683* (2006.01)

(52) U.S. Cl.
CPC .... *H01L 23/49838* (2013.01); *H01L 21/4857* (2013.01); *H01L 21/4864* (2013.01);
(Continued)

(58) Field of Classification Search
CPC .......... H05K 3/385; H05K 3/387; H05K 3/42; H05K 3/428; H01L 21/4857;
(Continued)

(56) References Cited

U.S. PATENT DOCUMENTS 5,426,850 A * 6/1995 Fukutomi .............. H05K 3/428
29/848
5,504,992 A * 4/1996 Fukutomi .............. H05K 3/428
204/192.17

FOREIGN PATENT DOCUMENTS

JP 2002-076578 3/2002
JP 2002-374066 12/2002
(Continued)

OTHER PUBLICATIONS

Office Action dated Mar. 10, 2020 issued with respect to the basic Japanese Patent Application No. 2016-232678 with full machine translation.

*Primary Examiner* — Carl J Arbes
(74) *Attorney, Agent, or Firm* — IPUSA, PLLC

(57) ABSTRACT

A method of manufacturing a wiring substrate includes providing a support that includes a support substrate and first and second metal layers stacked in order over the support substrate. A surface of the second metal layer facing away from the first metal layer is a roughened surface or formed of particles. The second metal layer is selectively etchable with respect to the first metal layer. The method further includes selectively forming a third metal layer on the surface of the second metal layer, forming a first wiring layer that is a laminate of the second and third metal layers by simultaneously roughening the third metal layer and dissolving the second metal layer not covered with the third metal layer using an etchant, forming an insulating layer that covers the first wiring layer on the first metal layer, removing the support substrate, and removing the first metal layer by etching.

19 Claims, 8 Drawing Sheets

(52) U.S. Cl.
CPC .... *H01L 21/6835* (2013.01); *H01L 23/49822*
(2013.01); *H01L 23/49866* (2013.01); *H01L
21/486* (2013.01); *H01L 2221/68345*
(2013.01); *H01L 2221/68359* (2013.01)

(58) Field of Classification Search
CPC ............ H01L 21/2146; H01L 21/4864; H01L
21/6835; H01L 23/49822; H01L
23/49838; H01L 23/49866; H01L
2221/68345; H01L 2221/68359
See application file for complete search history.

(56) References Cited

FOREIGN PATENT DOCUMENTS

| | | | |
|---|---|---|---|
| JP | 2002374066 A | * | 12/2002 |
| JP | 2003-152341 | | 5/2003 |
| JP | 2003152341 A | * | 5/2003 |
| JP | 2005-101137 | | 4/2005 |

* cited by examiner

METHOD OF MANUFACTURING WIRING SUBSTRATE

CROSS-REFERENCE TO RELATED APPLICATION

This application is based upon and claims the benefit of priority of the prior Japanese Patent Application No. 2016-232678, filed on Nov. 30, 2016, the entire contents of which are incorporated herein by reference.

FIELD

A certain aspect of the embodiments discussed herein is related to methods of manufacturing a wiring substrate.

BACKGROUND

A support in which thick copper foil, a peelable layer, and thin copper foil are stacked in order on a support substrate is known. To manufacture a wiring substrate using this support, first, a resist layer having openings is formed on the thin foil. Then, a copper wiring layer is formed on the thin foil exposed in the openings. After removal of the resist layer, an insulating layer is formed on the thin foil to cover the wiring layer. Another wiring layer and another insulating layer are further stacked in order on the insulating layer on an as-needed basis, and the support substrate and the thick foil are thereafter mechanically removed by removing the peelable layer. Furthermore, the thin foil is removed by etching. (See, for example, Japanese Patent No. 4273895.)

Furthermore, a support in which thick copper foil, a peelable layer, and thin foil formed of a metal selectively etchable with respect to a wiring layer are stacked in order on a support substrate is known. To manufacture a wiring substrate using this support, a resist layer having openings is formed on the thin foil. Then, a wiring layer is formed on the thin foil exposed in the openings. After removal of the resist layer, an insulating layer is formed on the thin foil to cover the wiring layer. Another wiring layer and another insulating layer are further stacked in order on the insulating layer on an as-needed basis, and the support substrate and the thick foil are thereafter mechanically removed by removing the peelable layer. Furthermore, the thin foil is removed by etching. (See, for example, Japanese Laid-open Patent Publication No. 2002-76578.)

SUMMARY

According to an aspect of the present invention, a method of manufacturing a wiring substrate includes providing a support that includes a support substrate and first and second metal layers stacked in order over the support substrate. A surface of the second metal layer facing away from the first metal layer is a roughened surface or formed of particles. The second metal layer is selectively etchable with respect to the first metal layer. The method further includes selectively forming a third metal layer on the surface of the second metal layer, forming a first wiring layer that is a laminate of the second and third metal layers by simultaneously roughening the third metal layer and dissolving the second metal layer not covered with the third metal layer using an etchant, forming an insulating layer that covers the first wiring layer on the first metal layer, removing the support substrate, and removing the first metal layer by etching.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
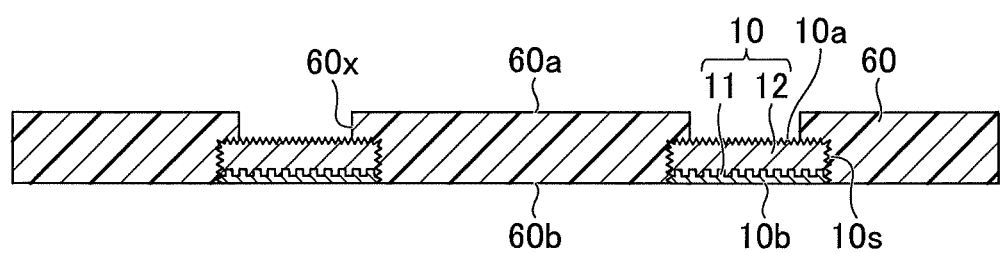
FIG. 1 is a diagram illustrating a wiring substrate according to a first embodiment.

According to the method of manufacturing a wiring substrate described in Japanese Patent No. 4273895, the thin foil and the wiring layer are soluble in the same etchant. Therefore, when the thin foil is removed by etching, an edge of the wiring layer as well is etched by over-etching. As a result, a surface of the wiring layer is depressed relative to a surface of the insulating layer. When soldering the wiring layer to, for example, a semiconductor chip with a depression formed in the surface of the wiring layer, solder is less likely to enter the depression, so that the connection reliability of the wiring substrate and the semiconductor chip may be reduced.

According to the method of manufacturing a wiring substrate described in Japanese Laid-open Patent Publication No. 2002-76578, the thin foil is selectively etchable with respect to the wiring layer. Therefore, the problem that the thickness of the wiring layer is reduced because of over-etching during the process of removing the thin foil does not occur. When the thin foil is nickel, however, nickel and the wiring layer may be delaminated at their interface because of the lack of adhesion between nickel and the wiring layer because a nickel surface is likely to be oxidized to form a passivation film. As a result, the yield rate of the wiring substrate is reduced.

According to an aspect of the present invention, a method of manufacturing a wiring substrate that makes it possible to improve connection reliability and a yield rate is provided.

Preferred embodiments of the present invention will be explained with reference to accompanying drawings. In the following description, the same elements or components are referred to using the same reference numeral, and duplicate description thereof may be omitted.

[a] First Embodiment

First, a structure of a wiring substrate according to a first embodiment is described. FIG. 1 is a cross-sectional view of a wiring substrate according to the first embodiment.

Referring to FIG. 1, a wiring substrate 1 is a coreless wiring substrate including a single wiring layer 10 and a single insulating layer 60. The wiring layer 10 has a laminated structure where a second layer 12 is stacked on a first layer 11.

According to the wiring substrate 1, the wiring layer 10 is buried in a lower surface 60b of the insulating layer 60. A lower surface 10b of the wiring layer 10 is exposed at the lower surface 60b of the insulating layer 60. Part of an upper surface 10a and a side surface 10s of the wiring layer 10 are covered with the insulating layer 60. The upper surface 10a of the wiring layer 10 is selectively exposed in openings 60x of the insulating layer 60. The lower surface 10b of the wiring layer 10 exposed at the lower surface 60b of the insulating layer 60 has, for example, a circular planar shape, and may be used as a pad to be connected to a semiconductor chip. The upper surface 10a of the wiring layer 10 selectively exposed in each of the openings 60x of the insulating layer 60 has, for example, a circular planar shape, and may be used as a pad to be connected to another wiring substrate or the like. Hereinafter, the openings 60x may be collectively referred to as "opening 60x" for convenience of description.

The wiring layer 10 may include a wiring pattern whose lower surface is exposed at the lower surface 60b of the insulating layer 60 and whose upper surface and side surface are covered with the insulating layer 60.

According to this embodiment, for convenience of description, the side of the wiring substrate 1 on which side the opening 60x of the insulating layer 60 is open will be referred to as a first side or an upper side, and the side of the wiring substrate 1 on which side the first layer 11 of the wiring layer 10 is exposed will be referred to as a second side or a lower side. Furthermore, with respect to each part or element of the wiring substrate 1, a surface on the first or upper side will be referred to as a first surface or an upper surface, and a surface on the second or lower side will be referred to as a second surface or a lower surface. The wiring substrate 1, however, may be used in an inverted position and may be oriented at any angle. Furthermore, a plan view refers to a view of an object taken in a direction normal to the first surface of the insulating layer 60, and a planar shape refers to the shape of an object viewed in a direction normal to the first surface of the insulating layer 60.

The first layer 11 of the wiring layer 10 may be formed using, for example, copper (Cu) or the like. The thickness of the first layer 11 may be, for example, approximately 0.01 µm to approximately 1.0 µm. The upper surface of the first layer 11 is a roughened surface. The surface roughness Ra of the upper surface of the first layer 11 may be, for example, approximately 0.3 µm to approximately 0.6 µm. The lower surface of the first layer 11 (the lower surface 10b of the wiring layer 10) may be, for example, flush with the lower surface 60b of the insulating layer 60. Unlike the upper surface of the first layer 11, the lower surface of the first layer 11 is not a roughened surface but a flat surface.

The second layer 12 of the wiring layer 10 may be formed using, for example, copper (Cu) or the like. The thickness of the second layer 12 may be, for example, approximately 30 µm. The upper surface of the second layer 12 is selectively exposed in the opening 60x of the insulating layer 60. The upper surface and the side surface of the second layer 12 are roughened surfaces. The surface roughness Ra of the upper surface and the side surface of the second layer 12 may be, for example, approximately 0.3 µm to approximately 0.6 µm.

By thus making the upper surface of the first layer 11 a roughened surface, the adhesion of the upper surface of the first layer 11 to the lower surface of the second layer 12 can be increased. As a result, it is possible to prevent the delamination of the first layer 11 and the second layer 12. Furthermore, by making the upper surface and the side surface of the second layer 12 (the upper surface 10a and the side surface 10s of the wiring layer 10) roughened surfaces, the adhesion of the second layer 12 (the wiring layer 10) to the insulating layer 60 can be increased.

The insulating layer 60 is a layer in which the wiring layer 10 is formed, and also serves as a solder resist layer. Suitable materials for the insulating layer 60 include, for example, a photosensitive epoxy insulating resin, a photosensitive acrylic insulating resin, a non-photosensitive (thermosetting) epoxy insulating resin, and a non-photosensitive (thermosetting) polyimide insulating resin. The thickness of the insulating layer 60 may be, for example, approximately 10 µm to approximately 50 µm. The thickness of the insulating layer 60 is the distance from the upper surface of the second layer 12 to an upper surface 60a of the insulating layer 60. (The same applies to the other insulating layers described below.) The insulating layer 60 has the opening 60x that is open at the upper surface 60a, and the upper surface of the second layer 12 of the wiring layer 10 is partly exposed in the opening 60x.

An external connection terminal such as a solder ball may be provided on the upper surface of the second layer 12 exposed in the opening 60x on an as-needed basis. In addition, a metal layer may be formed on the lower surface of the first layer 11 and/or the upper surface of the second layer 12 exposed in the opening 60x on an as-needed basis. Examples of metal layers include a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order). Instead of forming a metal layer, an anti-oxidation treatment such as an organic solderability preservative (OSP) process may be performed. A surface treatment layer faulted by the OSP process is an organic coating formed of, for example, an azole compound or an imidazole compound.

Next, a method of manufacturing a wiring substrate according to the first embodiment is described. FIGS. 2A through 2I are diagrams illustrating a process of manufacturing a wiring substrate according to the first embodiment. According to this embodiment, by way of example, a structure to become multiple wiring substrates is formed on a support, and after removal of the support, the structure is divided into individual wiring substrates. Alternatively, however, individual wiring substrates may be formed on a support, and the support may thereafter be removed.

Figure 2A:
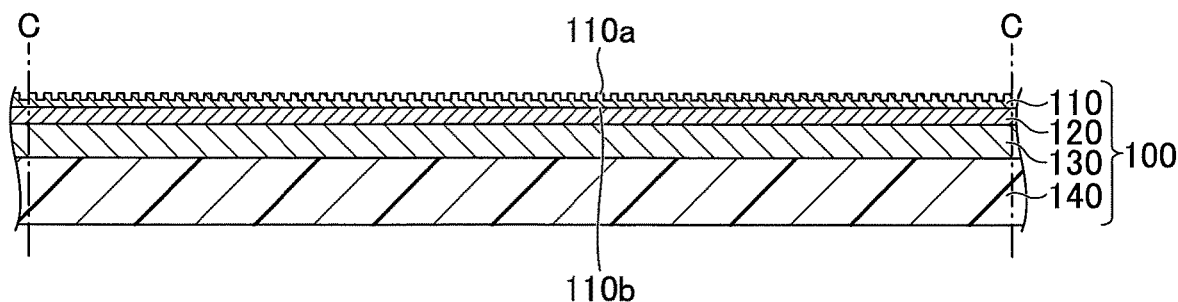
FIGS. 2A through 2I are diagrams illustrating a process of manufacturing a wiring substrate according to the first embodiment.

First, in the process depicted in FIG. 2A, a support 100 in which a metal layer 130, a metal layer 120, and a metal layer 110 are stacked in order on a support substrate 140 is prepared.

As the support substrate 140, for example, a cured prepreg may be used. A prepreg is, for example, a woven or non-woven fabric of glass fibers or aramid fibers (not depicted) impregnated with an epoxy insulating resin or the like. The thickness of the support substrate 140 may be, for example, approximately 18 µm to approximately 100 µm.

The metal layer 130 is, for example, metal foil (carrier foil) formed of copper and having a thickness of approximately 10 µm to approximately 50 µm. The metal layer 120 formed of, for example, nickel and having a thickness of approximately 1.5 µm to approximately 5 µm is peelably adhered onto the metal layer 130 through a peelable layer (not depicted). The metal layer 110 formed of, for example, copper and having a thickness of approximately 0.01 µm to approximately 1.0 µm is stacked on the metal layer 120. An upper surface 110a of the metal layer 110 is a roughened surface, and has a surface roughness greater than the surface roughness of a lower surface 110b of the metal layer 110. The roughened surface of the metal layer 110 may be formed by adjusting the composition of a plating solution in electroplating or by etching. The surface roughness Ra of the upper surface 110a of the metal layer 110 may be, for example, approximately 0.3 µm to approximately 0.6 µm. The metal layer 110 and the metal layer 120 are not limited to a combination of copper and nickel, and may employ metals that can be selectively etched with respect to each other.

Figure 2B:
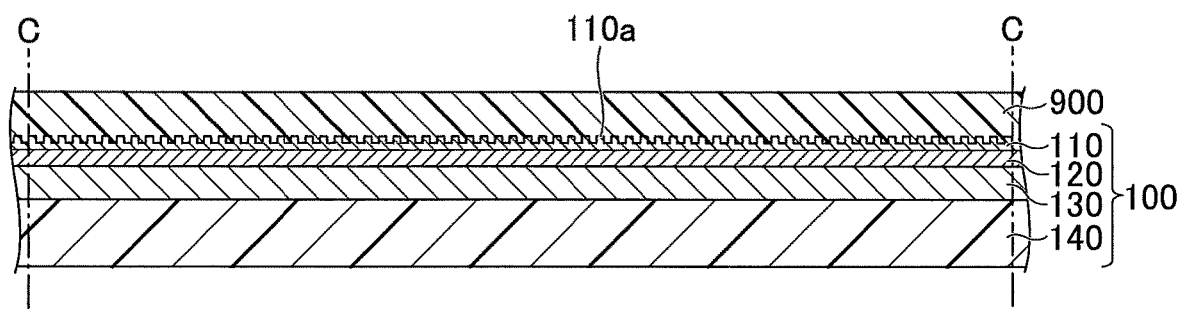

Next, in the process depicted in FIG. 2B, a resist layer 900 is formed on the upper surface 110a of the support 100. Specifically, for example, the upper surface 110a of the metal layer 110 is laminated with a dry film resist formed of photosensitive resin that serves as the resist layer 900. Because the upper surface 110a of the metal layer 110 is a roughened surface, the adhesion of the metal layer 110 to the resist layer 900 can be increased. As a result, it is possible to perform highly reliable patterning to make it possible to form fine wiring lines.

Figure 2C:
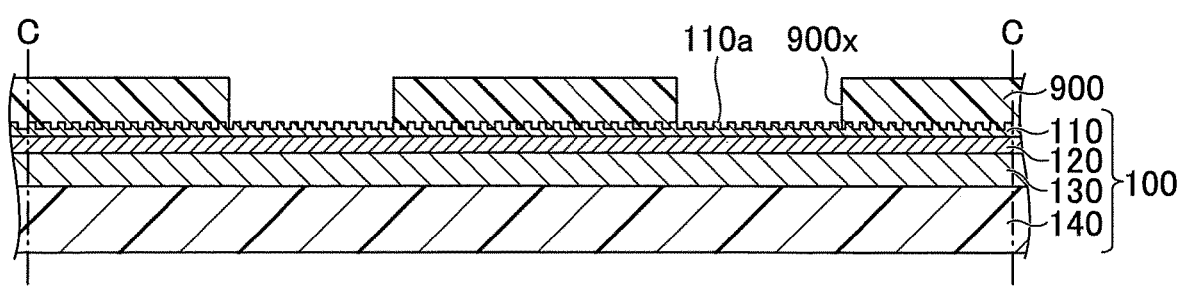

Next, in the process depicted in FIG. 2C, the resist layer 900 formed of, for example, a dry film resist is exposed to light and developed to be patterned. As a result, openings 900x that selectively expose the upper surface 110a (roughened surface) of the metal layer 110 are formed where the wiring layer 10 is to be formed in the resist layer 900.

Figure 2D:
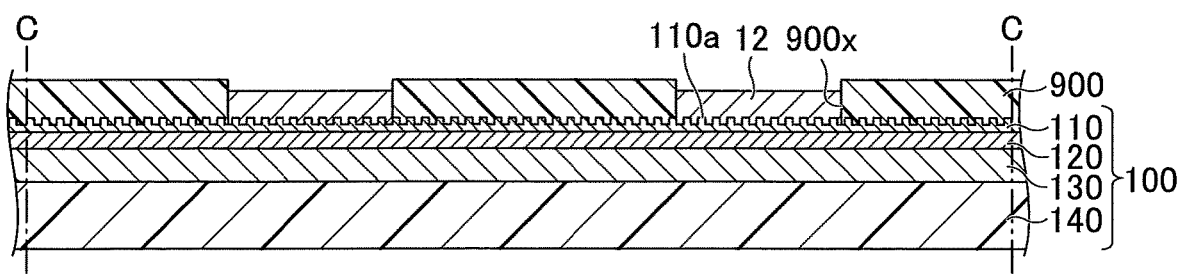

Next, in the process depicted in FIG. 2D, the second layer 12 is selectively formed on the upper surface 110a (roughened surface) of the metal layer 110 exposed in the openings 900x by electroplating, using the metal layer 110 as a plating power feed layer. The second layer 12 has a lower surface contacting the upper surface 110a of the metal layer 110 and has an upper surface exposed in the openings 900x. By forming a metal layer that is soluble in the same etchant as the metal layer 110 as the second layer 12, the surfaces of the second layer 12 and the metal layer 110 can be simultaneously roughened in the process depicted in FIG. 2F. The second layer 12 and the metal layer 110 may be, for example, copper layers.

Figure 2E:
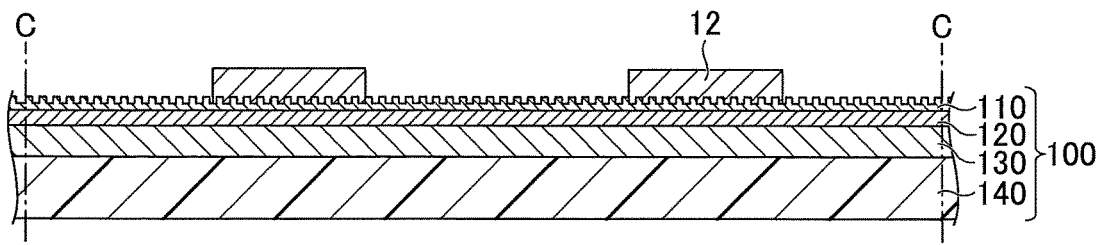

Next, in the process depicted in FIG. 2E, the resist layer 900 depicted in FIG. 2D is stripped. The resist layer 900 may be stripped using, for example, a stripping solution containing sodium hydroxide or the like.

Figure 2F:
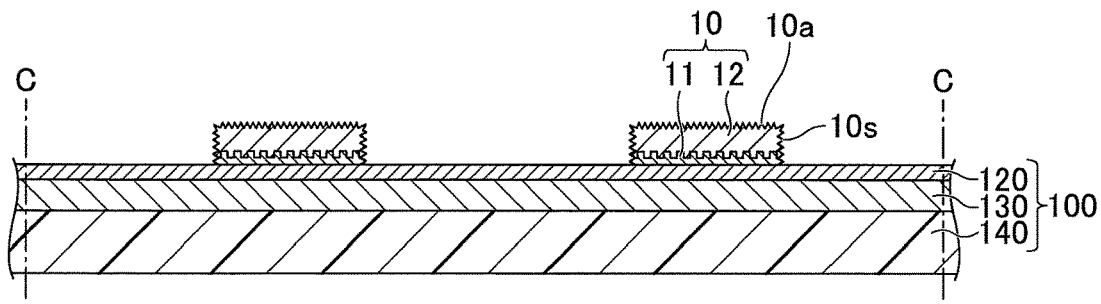

Next, in the process depicted in FIG. 2F, the second layer 12 is roughened and the metal layer 110 not covered with the second layer 12 is dissolved to be removed simultaneously using an etchant. As a result, the remainder of the metal layer 110 becomes the first layer 11, and the wiring layer 10 in which the second layer 12 is stacked on the first layer 11 is foamed. For example, when the first layer 11 and the second layer 12 are copper layers, an etchant such as an aqueous solution of hydrogen peroxide and sulfuric acid, an aqueous solution of sodium persulfate, or an aqueous solution of ammonium persulfate may be used. At this point, when the metal layer 120 is formed of nickel, the metal layer 120 serves as an etch stop layer to prevent the metal layer 130 from being etched.

At the same time that the metal layer 110 not covered with the second layer 12 is etched to be removed, the upper surface and the side surface of the second layer 12 are roughened (that is, the upper surface 10a and the side surface 10s of the wiring layer 10 are roughened). The surface roughness Ra of the upper surface 10a and the side surface 10s of the wiring layer 10 is preferably approximately 0.3 µm to approximately 0.6 µm. In this case, the amount of etching is approximately 0.35 µm to approximately 1.5 µm.

That is, in the process depicted in FIG. 2A, the metal layer 110 is formed to be so thick (as thick as, for example, approximately 0.01 µm to approximately 1.0 µm) as to be removable by the amount of etching of approximately 0.35 µm to approximately 1.5 µm. As a result, in the process depicted in FIG. 2F, at the same time that the upper surface 10a and the side surface 10s of the wiring layer 10 are etched to have a surface roughness Ra of approximately 0.3 µm to approximately 0.6 µm, the metal layer 110 not covered with the second layer 12 can be removed.

Figure 2G:
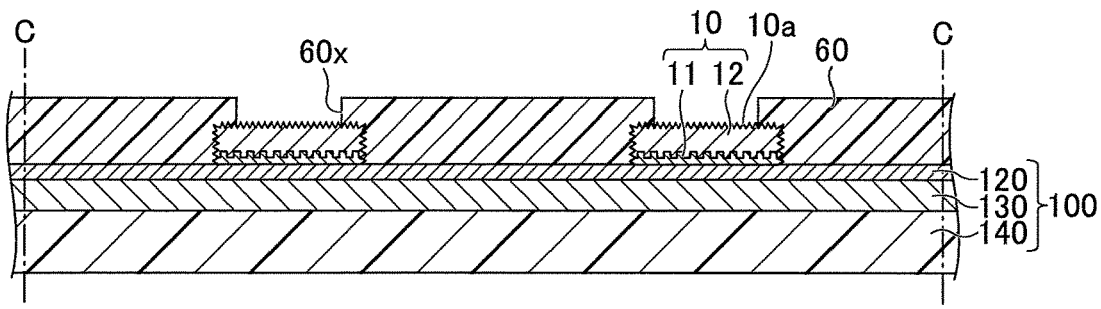

Next, in the process depicted in FIG. 2G, the insulating layer 60 is formed on the upper surface of the metal layer 120 to cover the wiring layer 10. The insulating layer 60 may be formed by applying, for example, an insulating resin in liquid or paste form by a process such as screen printing, roll coating, or spin coating to cover the wiring layer 10. Alternatively, the upper surface of the metal layer 120 may be laminated with an insulating resin in film form to cover the wiring layer 10 with the insulating resin. As the insulating resin, for example, a photosensitive or non-photosensitive epoxy insulating resin, acrylic insulating resin, or polyimide insulating resin may be used.

The laminate of insulating resin or the applied insulating resin is exposed to light and developed to form the opening 60x that selectively exposes the upper surface 10a of the wiring layer 10 in the insulating layer 60 (photolithography). In the case of using a non-photosensitive epoxy insulating resin or polyimide insulating resin as the material of the insulating layer 60, the opening 60x may alternatively be formed by, for example, laser processing or blasting. When the opening 60x is formed by laser processing, it is preferable to perform a desmear process to remove the residual resin of the insulating layer 60 adhering to the upper surface 10a of the wiring layer 10 exposed in the opening 60x.

Figure 2H:
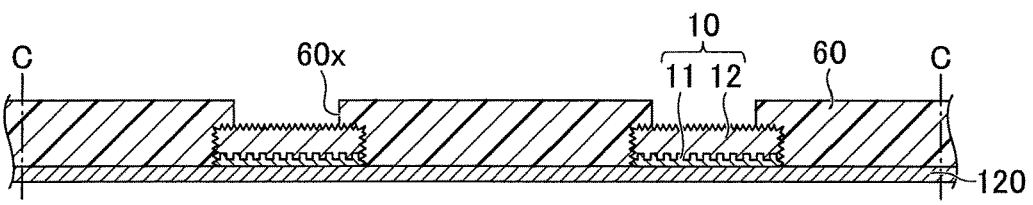

Next, in the process depicted in FIG. 2H, part of the support 100 is removed from the structure depicted in FIG. 2G. Specifically, a mechanical force is applied to the support 100 to delaminate the metal layer 120 and the metal layer 130 at their interface. As described above, the metal layer 120 is peelably adhered onto the metal layer 130 through a peelable layer (not depicted). Therefore, the metal layer 120 and the metal layer 130 can be easily delaminated at their interface. As a result, the metal layer 120 remains on the insulating layer 60, while the other members (the metal layer 130 and the support substrate 140) of the support 100 are removed.

Figure 2I:
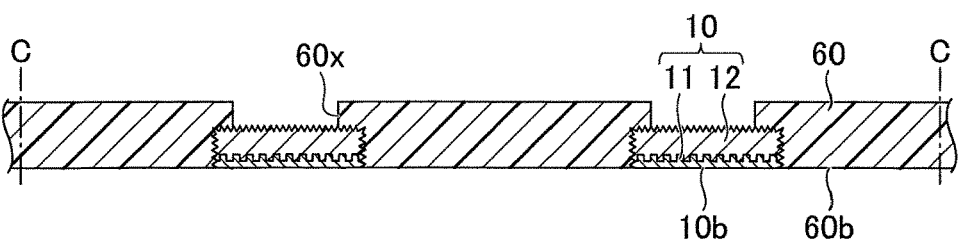

Next, in the process depicted in FIG. 2I, the metal layer 120 (see FIG. 2H) is removed. When the metal layer 120 is formed of nickel (Ni) and the first layer 11 of the wiring layer 10 is formed of copper (Cu), an etchant that removes nickel without removing copper is selected. For example, an etchant such as an aqueous solution of hydrogen peroxide and nitric acid may be used. As a result, it is possible to etch the metal layer 120 without etching the first layer 11 of the wiring layer 10. Consequently, the lower surface of the first layer 11 of the wiring layer 10 (the lower surface 10b of the wiring layer 10) is exposed at the lower surface 60b of the insulating layer 60. The lower surface of the first layer 11 of the wiring layer 10 may be, for example, flush with the lower surface 60b of the insulating layer 60.

The residue of the metal layer 110 that may be present in an area other than the area where the lower surface of the first layer 11 is exposed in the lower surface 60b of the insulating layer 60 can be removed by etching. In this case, the residue is small in amount. Therefore, there is little possibility that a depression is formed in the lower surface of the first layer 11 by etching. It is also possible to completely remove the metal layer 110 not covered with the second layer 12 in the process of FIG. 2F.

A metal layer may be formed on the lower surface of the first layer 11 of the wiring layer 10 exposed at the lower surface 60b of the insulating layer 60 and/or the upper surface of the second layer 12 of the wiring layer 10 exposed in the opening 60x by, for example, electroless plating on an as-needed basis. Examples of metal layers are as described above. Furthermore, an anti-oxidation treatment such as an OSP process may be performed on the lower surface of the first layer 11 of the wiring layer 10 exposed at the lower surface 60b of the insulating layer 60 and/or the upper surface of the second layer 12 of the wiring layer 10 exposed in the opening 60x.

After the process depicted in FIG. 2I, the structure depicted in FIG. 2I is cut at cutting positions C into individual pieces, using, for example, a slicer, to complete multiple wiring substrates 1 (FIG. 1). An external connection terminal such as a solder ball may be provided on the upper surface of the second layer 12 of the wiring layer 10 exposed in the opening 60x on an as-needed basis.

Thus, according to the method of manufacturing a wiring substrate of the first embodiment, the support 100, in which the metal layer 120 and the metal layer 110, which is selectively etchable with respect to the metal layer 120 and has a roughened upper surface, are stacked in order on the support substrate 140, is used. The second layer 12 is selectively formed on the roughened surface of the metal layer 110. The second layer 12 is roughened and the metal layer 110 not covered with the second layer 12 is dissolved to be removed simultaneously using an etchant. As a result, the wiring layer 10 in which the second layer 12 is stacked on the first layer 11 is formed.

Unlike conventional methods, the method of this embodiment obviates the necessity of the process of etching the metal layer 110 after the removal of the support substrate 140 and the metal layers 120 and 130. Therefore, the lower surface 10b of the wiring layer 10 is not depressed relative to the lower surface 60b of the insulating layer 60. Accordingly, the problem that solder is less likely to enter a depression does not occur when soldering the wiring layer 10 and a semiconductor chip or the like. Thus, the connection reliability of the wiring substrate 1 and a semiconductor chip or the like can be increased.

Furthermore, according to conventional methods, the wiring layer is required to initially have a large thickness in view of a decrease in the thickness of the wiring layer due to the depression of the lower surface of the wiring layer relative to the lower surface of the insulating layer. In this case, the thickness of a resist layer used to selectively form the wiring layer increases to make it difficult to increase the density of the wiring layer (provide fine wiring patterns). Compared with conventional methods, the method of manufacturing a wiring substrate according to the first embodiment can reduce the thickness of the resist layer, thus making it possible to increase the density of the wiring layer (provide fine wiring patterns).

Furthermore, according to the method of manufacturing a wiring substrate of the first embodiment, the metal layer 110 is formed on the metal layer 120 serving as an etch stop layer, and different materials may be selected for the metal layer 120 and the metal layer 110. Therefore, even when nickel is selected as the material of the metal layer 120 serving as an etch stop layer, the formation of a passivation film due to the oxidation of a nickel surface is suppressed because the nickel surface is covered with the metal layer 110. Furthermore, by selecting a material that is less likely to cause formation of a passivation film, such as copper, as the material of the metal layer 110, it is possible to avoid a decrease in the adhesion between the metal layer 110 and the second layer 12 due to a passivation film. As a result, the metal layer 110 and the second layer 12 are prevented from being delaminated at their interface, thus making it possible to increase the yield rate of the wiring substrate 1.

Furthermore, according to the method of manufacturing a wiring substrate of the first embodiment, a metal layer that is soluble in the same etchant as the metal layer 110 is preferably formed as the second layer 12. This makes it possible to roughen the side surface of the metal layer 110 covered with the second layer 12 and the upper surface and the side surface of the second layer 12 at the same time with the removal of the metal layer 110 not covered with the second layer 12. That is, because the removal of an unnecessary portion of the metal layer 110 and roughening for improving the adhesion to the insulating layer 60 can be simultaneously performed, it is possible to simplify the process of manufacturing the wiring substrate 1 and reduce the cost of the wiring substrate 1.

[b] Second Embodiment

In a second embodiment, a wiring substrate having a three-layer structure is illustrated. In the description of the second embodiment, a description of the same elements or components as those described in the first embodiment may be omitted.

Figure 3:
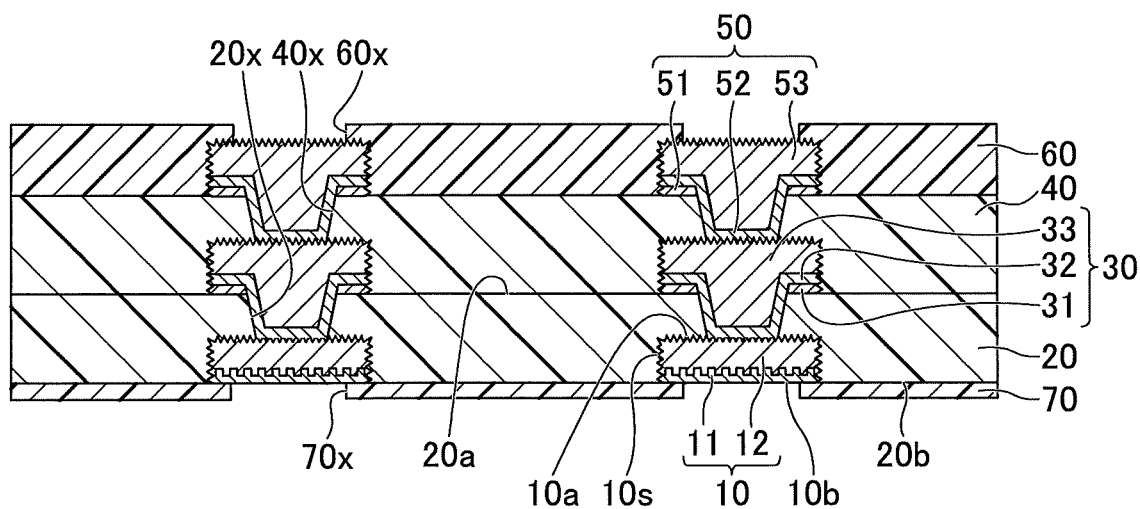
FIG. 3 is a diagram illustrating a wiring substrate according to a second embodiment.

First, a structure of a wiring substrate according to the second embodiment is described. FIG. 3 is a cross-sectional view of a wiring substrate according to the second embodiment. Referring to FIG. 3, a wiring substrate 2 according to the second embodiment is different from the wiring substrate 1 (see FIG. 1) in additionally including an insulating layer 20, a wiring layer 30, an insulating layer 40, a wiring layer 50, and an insulating layer 70.

The insulating layer 20 is formed to cover the upper surface 10a and the side surface 10s of the wiring layer 10. Suitable materials for the insulating layer 20 include, for example, a non-photosensitive (thermosetting) epoxy insulating resin, a non-photosensitive (thermosetting) polyimide insulating resin, a photosensitive epoxy insulating resin, and a photosensitive acrylic insulating resin. The insulating layer 20 may contain a filler such as silica ($SiO_2$). The thickness of the insulating layer 20 may be, for example, approximately 10 μm to approximately 50 μm. The insulating layer 20 includes via holes 20x (hereinafter collectively referred to as "via hole 20x" for convenience of description) that are open at an upper surface 20a of the insulating layer 20. The upper surface of the second layer 12 of the wiring layer 10 is partly exposed in the via hole 20x.

The wiring layer 30 is famed on the insulating layer 20. The wiring layer 30 includes a via interconnect filling in the via hole 20x that pierces through the insulating layer 20 to expose the upper surface 10a of the wiring layer 10, and a wiring pattern formed on the upper surface 20a of the insulating layer 20. The via hole 20x is a recess having the shape of an inverted truncated cone, and has an upper-side opening at the upper surface 20a of the insulating layer 20 and a lower-side opening on the upper surface 10a of the wiring layer 10. The upper-side opening is greater in diameter than the lower-side opening. The wiring layer 30 is electrically connected to the wiring layer 10 exposed at the bottom of the via hole 20x.

The wiring layer 30 includes a first layer 31, a second layer 32, and a third layer 33. The first layer 31 is formed around the via hole 20x on the upper surface 20a of the insulating layer 20. The second layer 32 is formed on the first layer 31 and extends from the upper surface of the first layer 31 to be formed along the inner wall surface of the via hole 20x to further cover the upper surface 10a of the wiring layer 10 exposed in the via hole 20x. The third layer 33 is formed on the second layer 32 to fill in the via hole 20x with the second layer 32 formed on the inner wall surface of the via hole 20x.

Suitable materials for the first layer 31, the second layer 32, and the third layer 33 include, for example, copper. The thickness of the first layer 31 may be, for example, approximately 0.5 µm to approximately 5 µm. The thickness of the second layer 32 may be, for example, approximately 0.3 µm to approximately 1.5 µm. The thickness of the third layer 33 may be, for example, approximately 4 µm to approximately 30 µm.

The side surface of the first layer 31 is a roughened surface. The side surface of the second layer 32 is a roughened surface. The upper surface and the side surface of the third layer 33 are roughened surfaces. That is, the upper surface and the side surface of the wiring layer 30 are roughened surfaces. The surface roughness Ra of the side surface of the first layer 31, the side surface of the second layer 32, and the upper surface and the side surface of the third layer 33 may be, for example, approximately 0.3 µm to approximately 0.6 µm.

The insulating layer 40 is formed to cover the upper surface and the side surface of the wiring layer 30. The material and the thickness of the insulating layer 40 may be the same as those of, for example, the insulating layer 20. The insulating layer 40 includes via holes 40x (hereinafter collectively referred to "via hole 40x" for convenience of description) that are open at the upper surface of the insulating layer 40. The upper surface of the third layer 33 of the wiring layer 30 is partly exposed in the via hole 40x.

The wiring layer 50 is formed on the insulating layer 40. The wiring layer 50 includes a via interconnect filling in the via hole 40x that pierces through the insulating layer 40 to expose the upper surface of the wiring layer 30, and a wiring pattern formed on the upper surface of the insulating layer 40. The via hole 40x is a recess having the shape of an inverted truncated cone, and has an upper-side opening at the upper surface of the insulating layer 40 and a lower-side opening on the upper surface of the wiring layer 30. The upper-side opening is greater in diameter than the lower-side opening. The wiring layer 50 is electrically connected to the wiring layer 30 exposed at the bottom of the via hole 40x.

The wiring layer 50 includes a first layer 51, a second layer 52, and a third layer 53. The structure and the material of the first layer 51, the second layer 52, and the third layer 53 of the wiring layer 50 may be the same as those of the first layer 31, the second layer 32, and the third layer 33 of the wiring layer 30.

The side surface of the first layer 51 is a roughened surface. The side surface of the second layer 52 is a roughened surface. The upper surface and the side surface of the third layer 53 are roughened surfaces. That is, the upper surface and the side surface of the wiring layer 50 are roughened surfaces. The surface roughness Ra of the side surface of the first layer 51, the side surface of the second layer 52, and the upper surface and the side surface of the third layer 53 may be, for example, approximately 0.3 µm to approximately 0.6 µm.

The insulating layer 60 is formed to cover the upper surface and the side surface of the wiring layer 50. The upper surface of the third layer 53 of the wiring layer 50 is partly exposed in the opening 60x. The upper surface of the wiring layer 50 selectively exposed in the opening 60x of the insulating layer 60 has, for example, a circular planar shape, and may be used as a pad to be connected to another wiring substrate or the like.

The insulating layer 70 is formed on a lower surface 20b of the insulating layer 20 to cover the wiring layer 10, and serves as a solder resist layer. The insulating layer 70 includes openings 70x (hereinafter collectively referred to as "opening 70x" for convenience of description) that selectively expose the wiring layer 10. The lower surface 10b of the wiring layer 10 exposed in the opening 70x has, for example, a circular planar shape, and may be used as a pad to be connected to a semiconductor chip. The material and the thickness of the insulating layer 70 may be the same as those of, for example, the insulating layer 60.

Next, a method of manufacturing a wiring substrate according to the second embodiment is described. FIGS. 4A through 4J are diagrams illustrating a process of manufacturing a wiring substrate according to the second embodiment. According to this embodiment, by way of example, a structure to become multiple wiring substrates is formed on a support, and after removal of the support, the structure is divided into individual wiring substrates. Alternatively, however, individual wiring substrates may be formed on a support, and the support may thereafter be removed.

First, the processes depicted in FIGS. 2A through 2F of the first embodiment are executed. Then, in the process depicted in FIG. 4A, metal foil 310 such as copper foil is stacked on the insulating layer 20. Specifically, for example, a prepreg having the metal foil 310 adhering to a surface of the prepreg ("metal foil-carrying prepreg") is prepared. The metal foil-carrying prepreg is stacked on the upper surface of the metal layer 120 to cover the wiring layer 10 with the prepreg, and is subjected to press forming using a die while being heated. As a result, the prepreg is cured, and the insulating layer 20 having the metal foil 310 stacked on its upper surface 20a is formed. Instead of a prepreg, a photo-sensitive or non-photosensitive resin that does not contain glass cloth may be used.

Figure 4A:
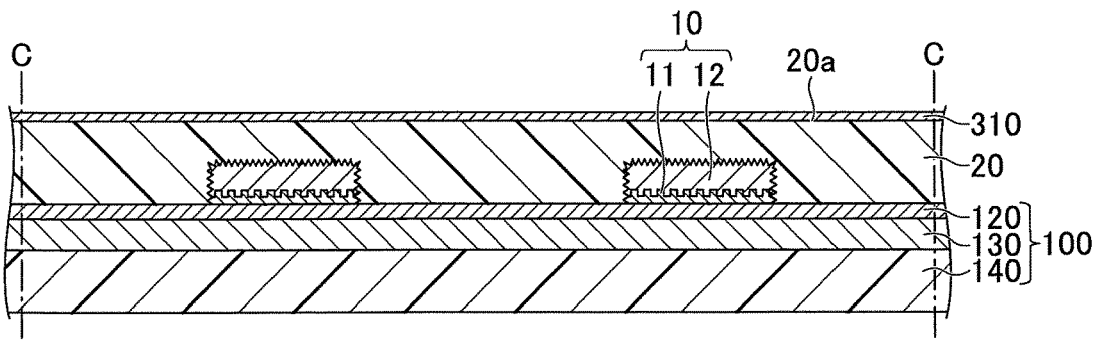
FIGS. 4A through 4J are diagrams illustrating a process of manufacturing a wiring substrate according to the second embodiment.
Figure 4B:
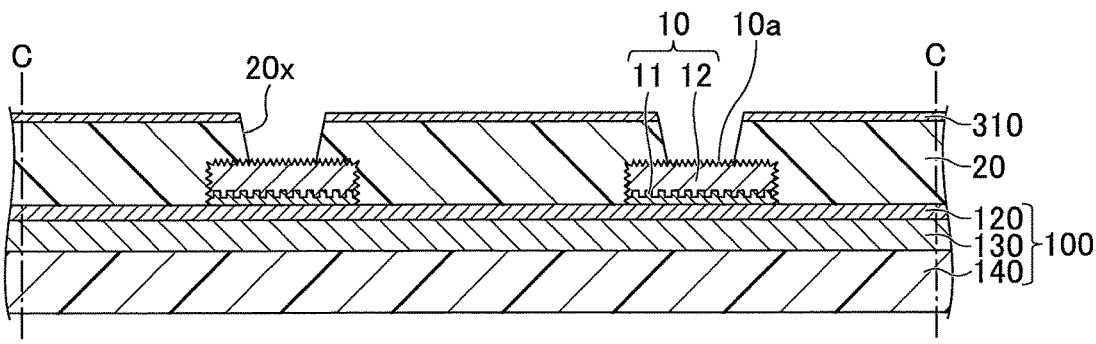

Next, in the process depicted in FIG. 4B, the via hole 20x that pierces through the metal foil 310 and the insulating layer 20 to expose the upper surface 10a of the wiring layer 10 is formed. The via hole 20x may be formed by, for example, laser processing that exposes the metal foil 310 and the insulating layer 20 to laser light. When the via hole 20x is formed by laser processing, it is preferable to perform a desmear process to remove the residual resin of the insulating layer 20 adhering to the upper surface 10a of the wiring layer 10 exposed in the via hole 20x.

Figure 4C:
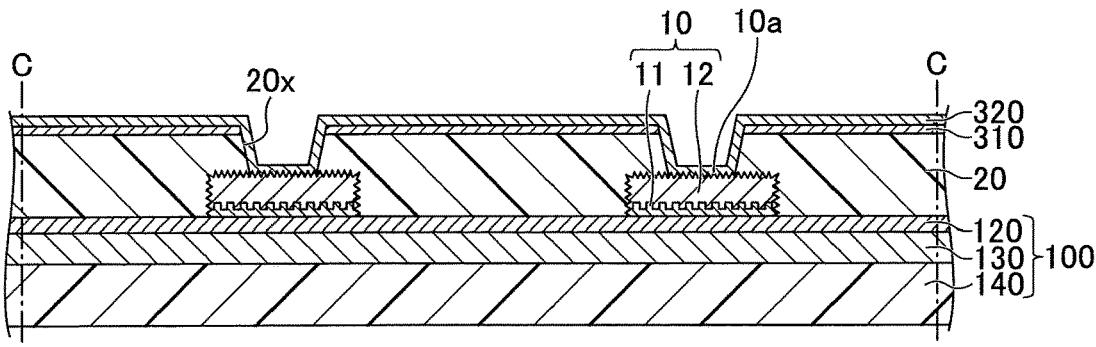

Next, in the processes depicted in FIG. 4C through 4F, the wiring layer 30 is formed. The wiring layer 30 may be formed by, for example, a semi-additive process. To form the wiring layer 30 using a semi-additive process, first, as depicted in FIG. 4C, a metal layer 320 of, for example, copper is formed as a seed layer by electroless plating or sputtering. The metal layer 320 is formed to continuously cover the entire upper surface of the metal foil 310, the inner wall surface of the via hole 20x, and the upper surface 10a of the wiring layer 10 exposed in the via hole 20x. The thickness of the metal layer 320 may be, for example, approximately 0.3 μm to approximately 1.5 μm.

Alternatively, the prepreg to become the insulating layer 20 may be stacked on the metal layer 120 without the metal foil 310 on the prepreg in the process depicted in FIG. 4A, and the metal layer 320 may be directly formed on the insulating layer 20 in the process depicted in FIG. 4C. In the case of using a metal foil-carrying prepreg, however, there is high adhesion between the insulating layer 20 and the metal foil 310. Therefore, forming the metal layer 320 on the metal foil 310, which, as a result, can increase the adhesion between the metal layer 320 and the insulating layer 20, is preferable.

Figure 4D:
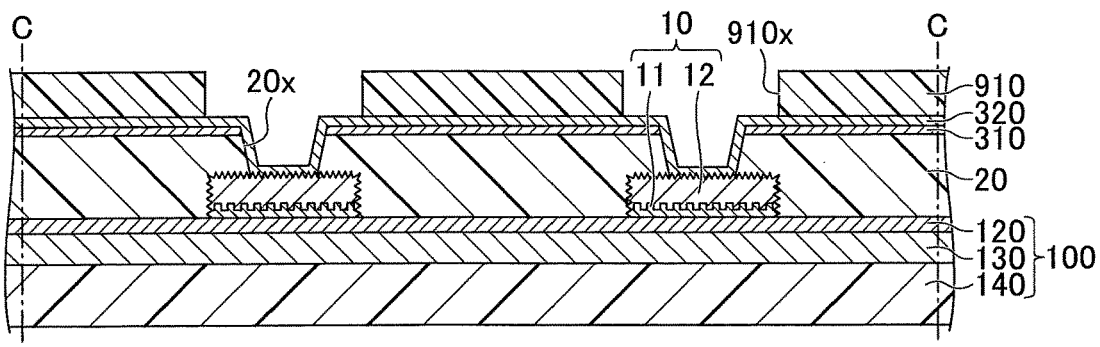
Figure 4E:
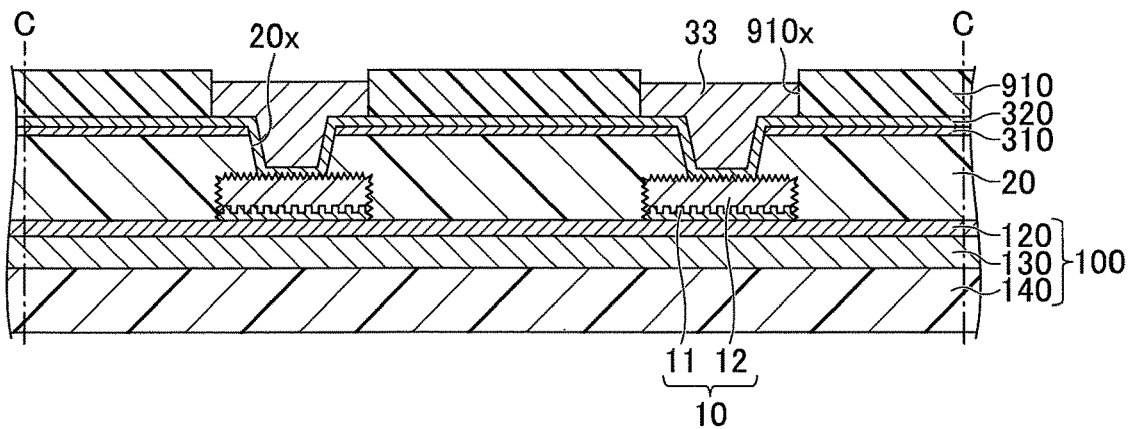

Next, as depicted in FIG. 4D, a resist layer 910 (such as a dry resist film) having openings 910x corresponding to the wiring layer 30 is formed on the metal layer 320. Then, as depicted in FIG. 4E, the third layer 33, which is an electroplating layer, is selectively formed in the openings 910x of the resist layer 910 by depositing copper or the like by electroplating, using the metal layer 320 as a power feed layer.

Figure 4F:
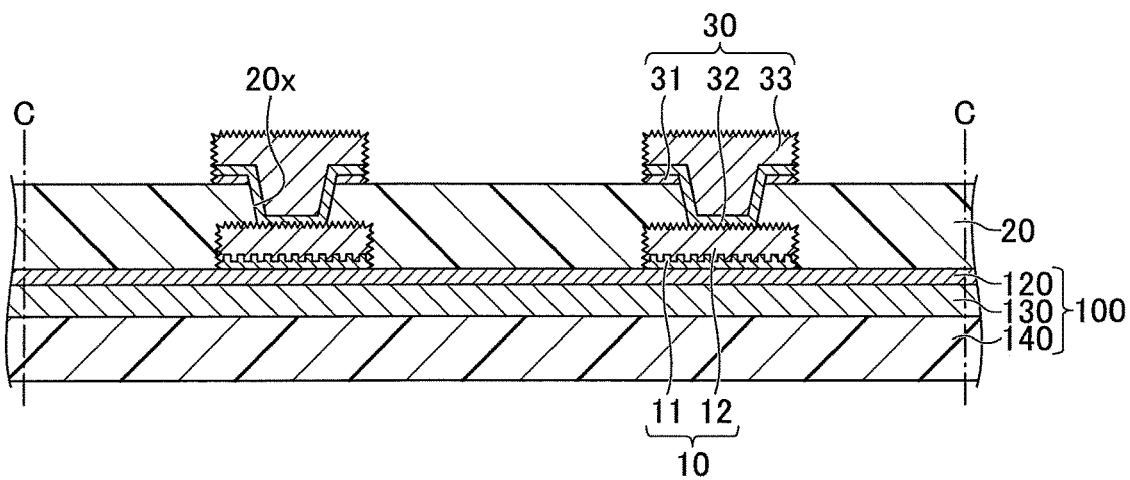

Next, as depicted in FIG. 4F, after removal of the resist layer 910, the metal foil 310 and the metal layer 320 not covered with the third layer 33 are removed by etching, using the third layer 33 as a mask. As a result, the first layer 31 is famed from the metal foil 310 and the second layer 32 is formed from the metal layer 320 to form the wiring layer 30 including the first layer 31, the second layer 32, and the third layer 33. For example, when the first layer 31 and the second layer 32 are formed of copper, an etchant such as an aqueous solution of hydrogen peroxide and sulfuric acid, an aqueous solution of sodium persulfate, or an aqueous solution of ammonium persulfate may be used.

At the same time that the metal foil 310 and the metal layer 320 not covered with the third layer 33 are etched to be removed, the side surfaces of the first layer 31 and the second layer 32 and the upper surface and the side surface of the third layer 33 are roughened (that is, the upper surface and the side surface of the wiring layer 30 are roughened). The upper surface and the side surface of the wiring layer 30 are roughened to increase the adhesion of the wiring layer 30 to the insulating layer 40 to be famed in a subsequent process. The surface roughness Ra of the upper surface and the side surface of the wiring layer 30 is preferably approximately 0.3 μm to approximately 0.6 μm. In this case, the amount of etching is approximately 0.35 μm to approximately 1.5 μm.

That is, in the processes depicted in FIGS. 4A and 4C, the metal foil 310 and the metal layer 320 are formed to have a total thickness (for example, 0.8 μm) that enables removal of the metal foil 310 and the metal layer 320 by the amount of etching of approximately 0.35 μm to approximately 1.5 μm. As a result, in the process depicted in FIG. 4F, at the same time that the upper surface and the side surface of the wiring layer 30 are etched to have a surface roughness Ra of approximately 0.3 μm to approximately 0.6 μm, the metal foil 310 and the metal layer 320 not covered with the third layer 33 can be removed. Alternatively, the removal of the seed layer and roughening may be performed in separate processes.

Figure 4G:
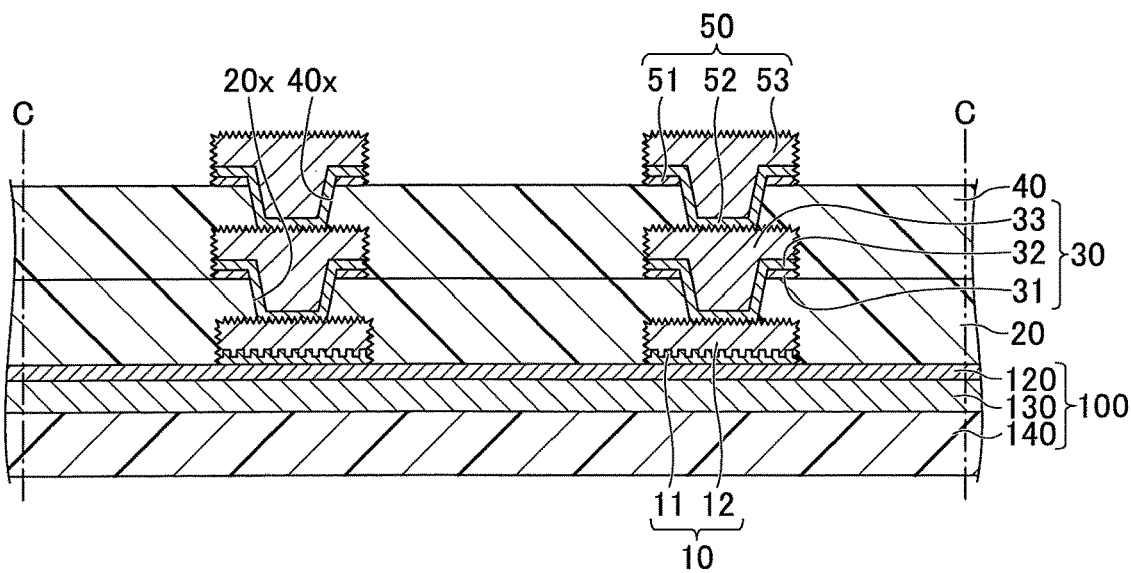

Next, in the process depicted in FIG. 4G, the same processes as those of FIGS. 4A through 4F are executed to form the insulating layer 40 and the wiring layer 50. Specifically, the insulating layer 40 is formed on the insulating layer 20 to cover the wiring layer 30. After formation of the via hole 40x that exposes the upper surface of the wiring layer 30 in the insulating layer 40, the wiring layer 50 is formed on the insulating layer 40 to electrically connect to the wiring layer 30 through the via hole 40x. The upper surface and the side surface of the wiring layer 50 are roughened in the same manner as the upper surface and the side surface of the wiring layer 30. The upper surface and the side surface of the wiring layer 50 are roughened to increase the adhesion of the wiring layer 50 to the insulating layer 60 to be formed in a subsequent process.

Figure 4H:
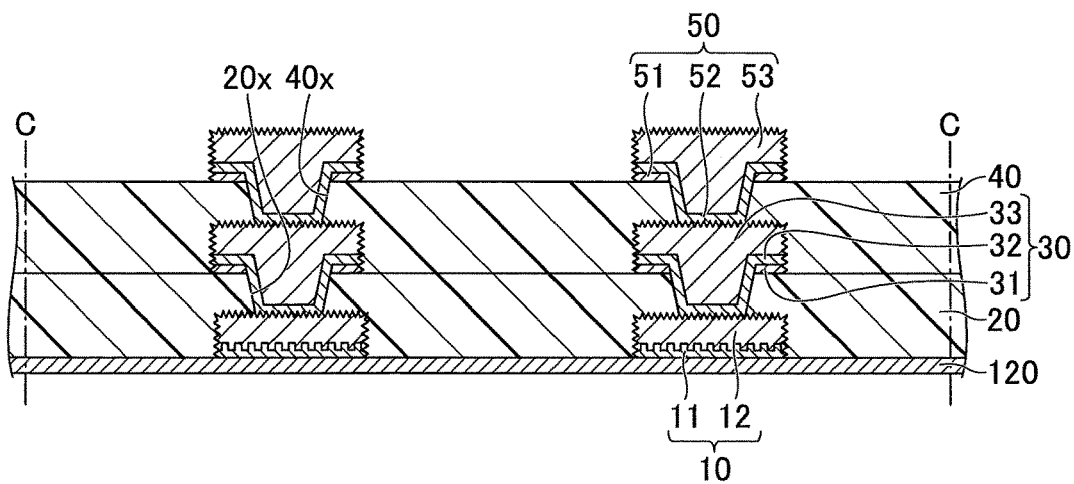

Next, in the process depicted in FIG. 4H, in the same manner as in the process depicted in FIG. 2H, part of the support 100 is removed from the structure depicted in FIG. 4G. Specifically, a mechanical force is applied to the support 100 to delaminate the metal layer 120 and the metal layer 130 at their interface. As a result, the metal layer 120 remains on the insulating layer 20, while the other members (the metal layer 130 and the support substrate 140) of the support 100 are removed.

Figure 4I:
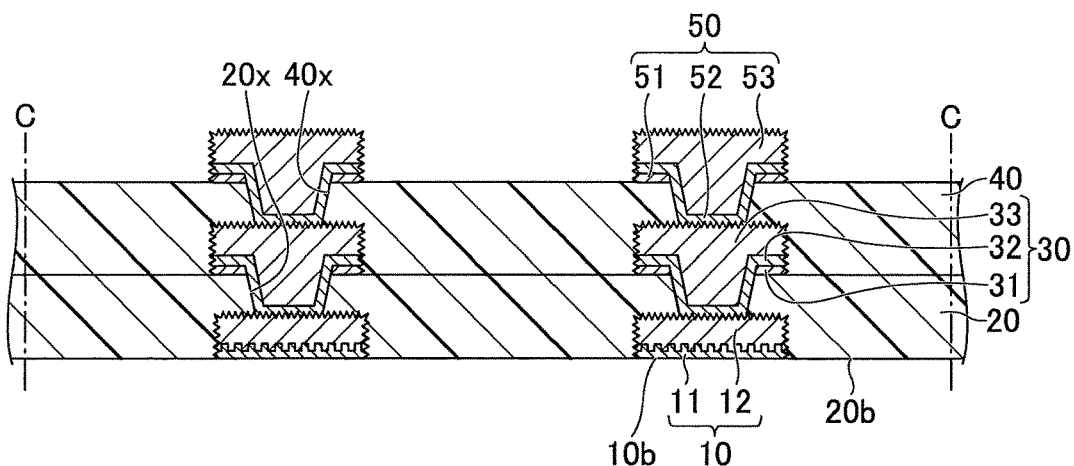

Next, in the process depicted in FIG. 4I, in the same manner as in the process depicted in FIG. 2I, the metal layer 120 (see FIG. 4H) is removed. As a result, the lower surface of the first layer 11 of the wiring layer 10 (the lower surface 10b of the wiring layer 10) is exposed at the lower surface 20b of the insulating layer 20. The lower surface of the first layer 11 of the wiring layer 10 may be, for example, flush with the lower surface 20b of the insulating layer 20.

The residue of the metal layer 110 that may be present in an area other than the area where the lower surface of the first layer 11 is exposed in the lower surface 20b of the insulating layer 20 can be removed by etching. In this case, the residue is small in amount. Therefore, there is little possibility that a depression is formed in the lower surface of the first layer 11 by etching.

Figure 4J:
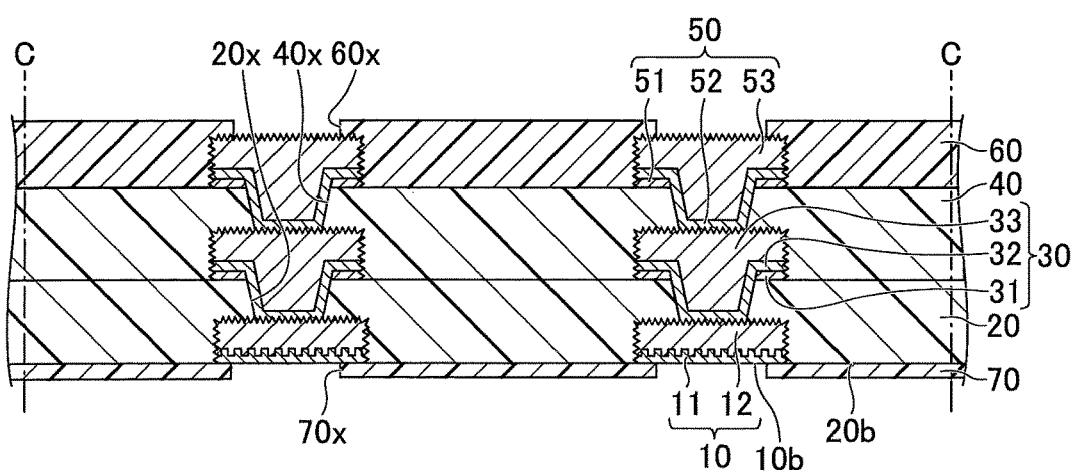

Next, in the process depicted in FIG. 4J, the insulating layer 60 is formed on the upper surface of the insulating layer 40 to cover the wiring layer 50. Furthermore, the insulating layer 70 is formed on the lower surface 20b of the insulating layer 20 to cover the wiring layer 10. The insulating layers 60 and 70 serve as solder resist layers. Then, the opening 60x is formed in the insulating layer 60 to selectively expose the upper surface of the wiring layer 50. Furthermore, the opening 70x is formed in the insulating layer 70 to selectively expose the lower surface 10b of the wiring layer 10. The insulating layers 60 and 70 and the openings 60x and 70x may be formed in the same manner as the insulating layer 60 and the opening 60x in the process depicted in FIG. 2G, for example.

A metal layer may be formed on the lower surface of the first layer 11 of the wiring layer 10 exposed at the lower surface 20b of the insulating layer 20 and/or the upper surface of the third layer 53 of the wiring layer 50 exposed in the opening 60x by, for example, electroless plating on an as-needed basis. Examples of metal layers are as described above. Furthermore, an anti-oxidation treatment such as an OSP process may be performed on the lower surface of the first layer 11 of the wiring layer 10 exposed at the lower surface 20b of the insulating layer 20 and/or the upper surface of the third layer 53 of the wiring layer 50 exposed in the opening 60x.

The insulating layer 60 may alternatively be formed after the formation of the wiring layer 50 in the process depicted in FIG. 4G. Furthermore, the insulating layer 70 may be formed on an as-needed basis.

After the process depicted in FIG. 4J, the structure depicted in FIG. 4J is cut at cutting positions C into individual pieces, using, for example, a slicer, to complete multiple wiring substrates 2 (FIG. 3). An external connection terminal such as a solder ball may be provided on the upper surface of the third layer 53 of the wiring layer 50 exposed in the opening 60x on an as-needed basis.

The wiring substrate 2 having a three-layer structure can be thus achieved. A desired number of insulating layers and a desired number of wiring layers may be alternately stacked on the wiring layer 50 to form a wiring substrate having a structure of four or more layers. The wiring substrate 2 produces the same effects as in the first embodiment. Furthermore, with respect to the second and subsequent wiring layers as well, it is possible to simultaneously perform removal of an unnecessary metal layer and roughening of a wiring layer for increasing the adhesion of the wiring layer to an insulating layer. Therefore, it is possible to simplify the process of manufacturing the wiring substrate 2 and reduce the cost of the wiring substrate 2.

Next, variations of the support 100 are described. In the following description, a description of the same elements or components as those of the above-described embodiments may be omitted.

Figure 5A:
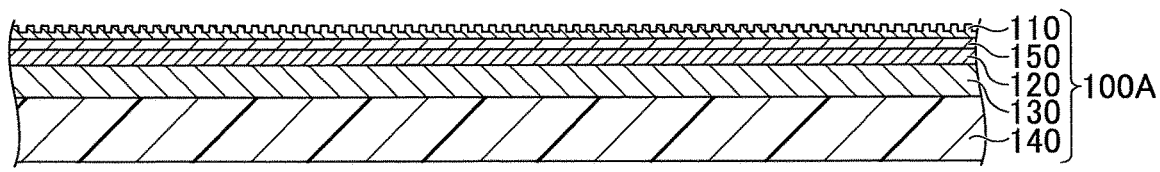
FIGS. 5A through 5C are cross-sectional views of variations of a support.
Figure 5B:
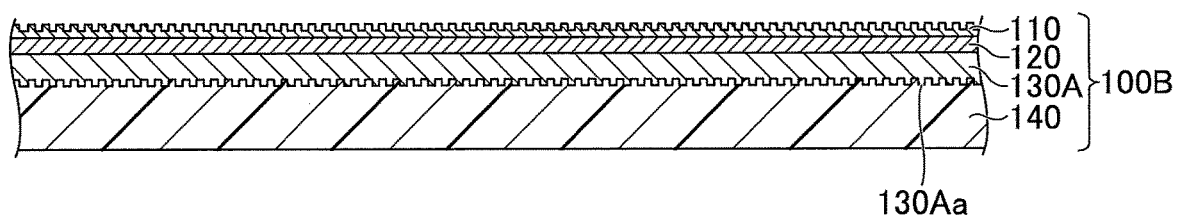
Figure 5C:
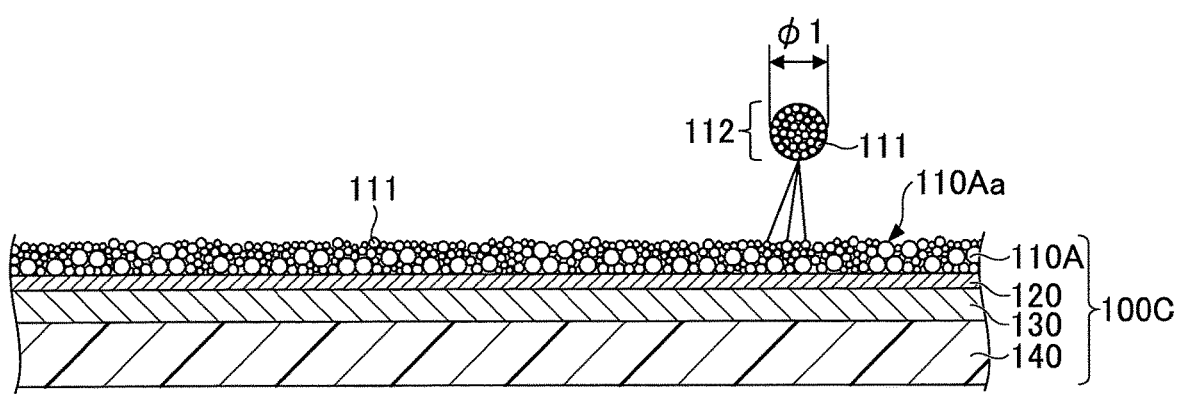

FIGS. 5A through 5C are cross-sectional views of variations of the support 100. Referring to FIG. 5A, according to a support 100A, a metal layer 150 formed by sputtering is interposed between the metal layer 120 and the metal layer 110. Suitable materials for the metal layer 150 include, for example, copper and nickel. The thickness of the metal layer 150 may be, for example, approximately 0.1 μm or less.

For example, when the metal layer 120 is nickel foil and the metal layer 110 is an electroplating copper layer, the adhesion between the metal layer 120 and the metal layer 110 may not be ensured. In this case, the adhesion between the metal layer 120 and the metal layer 110 can be increased by interposing the metal layer 150 formed by sputtering between the metal layer 120 and the metal layer 110.

Referring to FIG. 5B, according to a support 100B, a metal layer 130A is interposed between the support substrate 140 and the metal layer 120, and a lower surface 130Aa of the metal layer 130A, which contacts the support substrate 140, is a roughened surface. The surface roughness Ra of the lower surface 130Aa of the metal layer 130A may be, for example, approximately 0.3 μm to approximately 1.0 μm. By thus making a surface of the metal layer 130A that contacts the support substrate 140 a roughened surface, it is possible to increase the adhesion between the metal layer 130A and the support substrate 140. Like in the support 100A, the metal layer 150 formed by sputtering may be interposed between the metal layer 120 and the metal layer 110 in the support 100B.

Referring to FIG. 5C, according to a support 100C, a metal layer 110A formed of particles is provided on the metal layer 120. The metal layer 110A includes primary particles 111 and secondary particles 112 formed of primary particles 111.

The diameter of the primary particles 111 may be, for example, approximately 10 nm to approximately 200 nm, and more preferably, approximately 10 nm to approximately 40 nm. The diameter φ1 of the secondary particles 112 may be, for example, approximately 1 μm or less, and more preferably, approximately 400 nm or less. The cross-sectional shape of the primary particles 111 and the secondary particles 112 is not limited to a circular shape, and may be any of various shapes such as an elliptical shape and a polygonal shape.

The surface roughness Rz (ten-point average roughness) of an upper surface 110Aa of the metal layer 110A may be less than or equal to 2.0 μm (Rz≤2.0 μm). The surface roughness Rz includes irregularities generated by following the surface roughness of the metal layer 120 under the metal layer 110A.

The metal layer 110A may be formed by, for example, depositing copper in dendrite or particulate form on the surface of the metal layer 120 by performing cathode electrolysis near the limiting current density in a copper sulfate solution. To prevent removal of the copper deposits, the upper surface 110Aa of the metal layer 110A may be covered with, for example, copper plating. In this case, the surface roughness may follow the surface roughness of the upper surface 110Aa of the metal layer 110A before the metal layer 110A is covered with the copper plating. Alternatively, the surface of the copper plating covering the upper surface 110Aa of the metal layer 110A may be newly roughened.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, in manufacturing the wiring substrate 1 or the wiring substrate 2, a support that has the metal layer 130, the metal layer 120, and the metal layer 110 stacked in order on each side of the support substrate 140 may be used. In this case, components to become a wiring substrate may be formed on each side of the support, and thereafter, unnecessary parts of the support may be separated or removed.

Furthermore, a peelable layer does not necessarily have to be provided in the support. For example, in the support, only peripheral portions of the metal layer 120 and the metal layer 130 may be bonded together without provision of a peelable layer. According to this structure, the metal layer 120 and the metal layer 130 are only in contact in an area other than the peripheral portions. In this case, in the process depicted in FIG. 2H, the metal layer 130 and the support substrate 140 may be easily separated from the metal layer 120 by cutting off and removing the bonded peripheral portions of the metal layer 120 and the metal layer 130 of the structure depicted in FIG. 2G.

Furthermore, the first layer 11 may be removed by etching during the process of roughening the surface of the wiring layer 10 in forming the insulating layer 70. In this case as well, a depression is limited to hardly affect electronic component mountability.

What is claimed is:

1. A method of manufacturing a wiring substrate, comprising:
   providing a support that includes a support substrate, a first metal layer over the support substrate, and a second metal layer on the first metal layer, wherein a surface of the second metal layer facing away from the first metal layer is a roughened surface or formed of particles, and the second metal layer is selectively etchable with respect to the first metal layer;
   selectively forming a third metal layer on the roughened surface or the surface formed of the particles of the second metal layer, the third metal layer being soluble in a same etchant as the second metal layer;

forming a first wiring layer that is a laminate of the second metal layer and the third metal layer by simultaneously roughening the third metal layer and dissolving the second metal layer not covered with the third metal layer, using an etchant;

fainting an insulating layer that covers the first wiring layer on the first metal layer;

removing the support substrate;

removing the first metal layer by etching; and removing a residue of the second metal layer by etching after said removing the first metal layer by etching.

2. The method as claimed in claim 1, wherein the first metal layer is nickel, and the second metal layer and the third metal layer are copper.

3. The method as claimed in claim 1, wherein said providing the support provides the support that includes a fourth metal layer formed by sputtering between the first metal layer and the second metal layer.

4. The method as claimed in claim 1, wherein said providing the support provides the support that includes a fourth metal layer between the support substrate and the first metal layer.

5. The method as claimed in claim 4, wherein a surface of the fourth metal layer contacting the support substrate is a roughened surface.

6. The method as claimed in claim 1, wherein
said forming the first wiring layer forms the first wiring layer that includes a roughened surface facing away from the first metal layer and a roughened side surface, and
said forming the insulating layer forms the insulating layer that covers the roughened surface and the roughened side surface of the first wiring layer.

7. The method as claimed in claim 1, wherein said removing a residue of the second metal layer by etching removes the residue of the second metal layer on a surface of the insulating layer exposed by said removing the first metal layer by etching.

8. A method of manufacturing a wiring substrate, comprising:
providing a support that includes a support substrate, a first metal layer over the support substrate, and a second metal layer on the first metal layer, wherein a surface of the second metal layer facing away from the first metal layer is a roughened surface or formed of particles, and the second metal layer is selectively etchable with respect to the first metal layer;
selectively forming a third metal layer on the surface of the second metal layer;
forming a first wiring layer that is a laminate of the second metal layer and the third metal layer by simultaneously roughening the third metal layer and dissolving the second metal layer not covered with the third metal layer, using an etchant;
forming an insulating layer that covers the first wiring layer on the first metal layer such that a surface of the first wiring layer facing away from the first metal layer is exposed through an opening of the insulating layer;
removing the support substrate; and
removing the first metal layer by etching.

9. The method as claimed in claim 8, further comprising:
forming a second wiring layer on the insulating layer.

10. The method as claimed in claim 9, wherein said forming the second wiring layer includes
forming a seed layer on the insulating layer;
selectively forming an electroplating layer on the seed layer; and
removing the seed layer not covered with the electroplating layer by etching to form the second wiring layer, the second wiring layer being a laminate of the seed layer and the electroplating layer.

11. The method as claimed in claim 8, further comprising:
removing a residue of the second metal layer by etching after said removing the first metal layer by etching.

12. The method as claimed in claim 8, wherein said dissolving the second metal layer not covered with the third metal layer, using etching, completely removes the second metal layer not covered with the third metal layer.

13. The method as claimed in claim 8, wherein said selectively forming the third metal layer forms the third metal layer that is soluble in a same etchant as the second metal layer.

14. The method as claimed in claim 8, wherein the first metal layer is nickel, and the second metal layer and the third metal layer are copper.

15. The method as claimed in claim 8, wherein said providing the support provides the support that includes a fourth metal layer fainted by sputtering between the first metal layer and the second metal layer.

16. The method as claimed in claim 8, wherein said providing the support provides the support that includes a fourth metal layer between the support substrate and the first metal layer.

17. The method as claimed in claim 16, wherein a surface of the fourth metal layer contacting the support substrate is a roughened surface.

18. The method as claimed in claim 8, wherein
said forming the first wiring layer forms the first wiring layer that includes a roughened surface facing away from the first metal layer and a roughened side surface, and
said forming the insulating layer forms the insulating layer that covers the roughened surface and the roughened side surface of the first wiring layer.

19. The method as claimed in claim 8, wherein said removing the first metal layer exposes a surface of the insulating layer and a surface of the first wiring layer that are flush with each other.

* * * * *